US005736908A

United States Patent [19]

Alexanian et al.

[11] Patent Number: 5,736,908

[45] Date of Patent: Apr. 7, 1998

[54] WAVEGUIDE-BASED SPATIAL POWER COMBINING ARRAY AND METHOD FOR USING THE SAME

[75] Inventors: Angelos Alexanian, Goleta; Robert A. York, Santa Barbara, both of Calif.

[73] Assignee: The Regents of the University of California, Oakland, Calif.

[21] Appl. No.: 666,803

[22] Filed: Jun. 19, 1996

[51] Int. Cl.[6] .................... H01P 5/12; H03F 3/60

[52] U.S. Cl. .................... 333/125; 333/136; 333/137; 333/34; 330/286; 330/295

[58] Field of Search .................... 333/125, 127, 333/128, 136, 137, 34; 330/286, 295

[56] References Cited

U.S. PATENT DOCUMENTS

| | | | |
|---|---|---|---|
| 4,291,278 | 9/1981 | Quine | 333/128 |
| 4,588,962 | 5/1986 | Saito et al. | 333/137 |
| 5,057,908 | 10/1991 | Weber | 357/81 |
| 5,600,286 | 2/1997 | Livingston et al. | 333/26 |

*Primary Examiner*—Robert Pascal
*Assistant Examiner*—Barbara Summons
*Attorney, Agent, or Firm*—Daniel L. Dawes

[57] ABSTRACT

A quasi-optical power combining array provides broadband, well heat sinked performance by means of coupling an array of parallel slotline transition modules between a input waveguide and an output waveguide. Each slotline transition module is comprised of a heat sinked ceramic substrate upon which a pair of tapered slot transitions is defined, each of which lead to a quasi-optical element such as an amplifier, which in turn is coupled to a corresponding pair of tapered slot transitions leading to the output waveguide. Each slotline module is symmetrically formed to maximize input and output tuning and selectively balanced operation.

29 Claims, 8 Drawing Sheets

WAVEGUIDE-BASED SPATIAL POWER COMBINING ARRAY AND METHOD FOR USING THE SAME

This invention was made with Government support under Grant No. ECS 9308979, awarded by the National Science Foundation. The Government has certain rights in this invention.

BACKGROUND OF THE INVENTION

1. Field of the Invention

The invention relates to the field of high power solid state components for use at microwave and millimeter wave frequencies, and in particular to a waveguide-based spatial power combiner which incorporates high combining efficiency with broadband tapered slot transitions.

2. Description of the Prior Art

High speed device technology has advanced to the point where 300 GHz transistors and 1 THz diodes can be routinely fabricated. However, millimeter wave devices have yet to find widespread use due to their extremely limited power handling capacity and the expense associated with fabrication of conventional hybrid circuits at these frequencies. As a result, the lack of availability of compact high power sources has slowed or prevented development of many millimeter wave systems despite increasing demand.

Vacuum electronics is still the dominant technology for power in the millimeter wave region, but solid state electronic designs are generally more desirable in terms of size, weight, reliability and manufacturability. Cost of production is a major concern, which favors solid state systems which can be mass produced using integrated circuit technology. To achieve the kind of power that is needed for many applications, the power from many individual devices must be added coherently. Many types of power combining devices have been devised, but they have performed poorly at millimeter wave frequencies where large numbers of devices must be used. Quasi optical power combining methods solve many of the problems which plague other types of combiners. But at the same time quasi optical power combining methods introduce new problems of their own.

What is needed is a device which can be used in a waveguide-based power combiner with broadband performance and compactness but having good heat sinking capacities and expandable circuit capacity.

BRIEF SUMMARY OF THE INVENTION

The invention is a quasi-optical power combiner comprising a source for providing an input illumination field, and an array of slotline modules illuminated by the source. Each of the slotline modules of the array includes at least one circuit element and couples the input illumination field into the circuit element. An output from the circuit element is coupled by the slotline module to an output illumination field. An output is disposed in the output illumination field so that the plurality of outputs from the array of slotline modules are combined. As a result, high power combination is achieved. In one application, the circuit element is a quasi-optical amplifier, but any active or passive device may be used.

In the illustrated embodiment the source and output are waveguides, but may be any source or output device now known or later devised including without limitation rectangular waveguides, circular waveguides, lenses and waveguides and antennas.

The slotline module of the array comprises a tapered slot transition arranged and configured for signal matching between the source, the slotline module and the output. In particular each slotline module comprises a pair of tapered slot transitions coupling the circuit element to the source and the circuit element to the output, respectively.

In the illustrated embodiment, the shape of the tapered slot transition is described by the curve $y=a\,(1-\cos(\pi x/2b))+d$, where b is the longitude and length of the tapered slot transition, $2(a+d)$ is a maximum width provided by the tapered slot transition and $2d$ is a minimum width provided by the tapered slot transition. It is to be expressly kept in mind that many other tapers than this one are also possible.

The array of slotline modules are laterally distributed across the input illumination field of the source to approximately evenly distribute power in the illumination field among the slotline modules of the array. In the illustrated embodiment, the waveguide is dielectrically loaded to enhance uniformity of the input illumination field and to approximately uniformly illuminate the output. Sidewall corrugations could also be used to enhance uniformity of the illumination.

Each slotline module has a horizontal and vertical axis and is symmetrically arranged with respect to the horizontal and vertical axes with respect to slotline transitions provided on the slotline module and each quasi-optical amplifier or circuit element connected thereto.

Each of the slotline modules is disposed upon a thermally conductive heat sink, such as a substrate of aluminum nitride.

Each of the slotline modules of the array is disposed relative to the source and output to enhance tuning from the source to the array of slotline modules and from the array of slotline modules to the output. For example, where the source and output are waveguides, the array of slotline modules are longitudinally disposed within the waveguides to optimize tuning. Thus the slotline modules may be entirely enclosed or predominantly exposed.

The invention is also characterized as a method for providing quasi-optical power combination comprising the steps of illuminating a source field with quasi-optical power, transferring the quasi-optical power from the source field into an array of slotline modules, operating on the quasi-optical power transferred into the array of slotline modules within an active or passive solid state circuit element included in each of the slotline modules of the array, and transferring the power from the circuit elements through the array of slotline modules to illuminate an output field wherein the quasi-optical power from the plurality of quasi-optical elements is combined in the output field.

In particular the step of transferring the quasi-optical power from the source field into the array of slotline modules comprises the step of transferring the optical power through a plurality of parallel tapered slotline transitions. The step of transferring the quasi-optical power operated on by the quasi-optical elements comprises the step of transferring the quasi-optical power from the quasi-optical elements through a corresponding plurality of tapered slotline transitions. Typically the step of operating on the quasi-optical power by the plurality of quasi-optical elements comprises the step of amplifying the optical power by the quasi-optical elements, each of which is comprised of an amplifier.

The method further comprises the steps of providing the quasi-optical power to a source to provide the source field and receiving the quasi-optical power in an output from the output field.

The invention may now be better visualized by turning to the following drawings where alike elements are referenced by like numerals.

The invention and its various embodiments may now be better understood by turning to the following detailed description.

DETAILED DESCRIPTION OF THE PREFERRED EMBODIMENTS

A quasi-optical power combining array provides broadband, well heat sinked performance by means of coupling an array of parallel slotline transition modules between an input waveguide and an output waveguide. Each slotline transition module is comprised of a heat sinked dielectric or ceramic substrate upon which a pair of tapered slot transitions is defined, each of which lead to a quasi-optical element such as an amplifier, which in turn is coupled to a corresponding pair of tapered slot transitions leading to the output waveguide. Each slotline module is symmetrically formed to maximize input and output tuning and selectively balanced operation.

Figure 1:
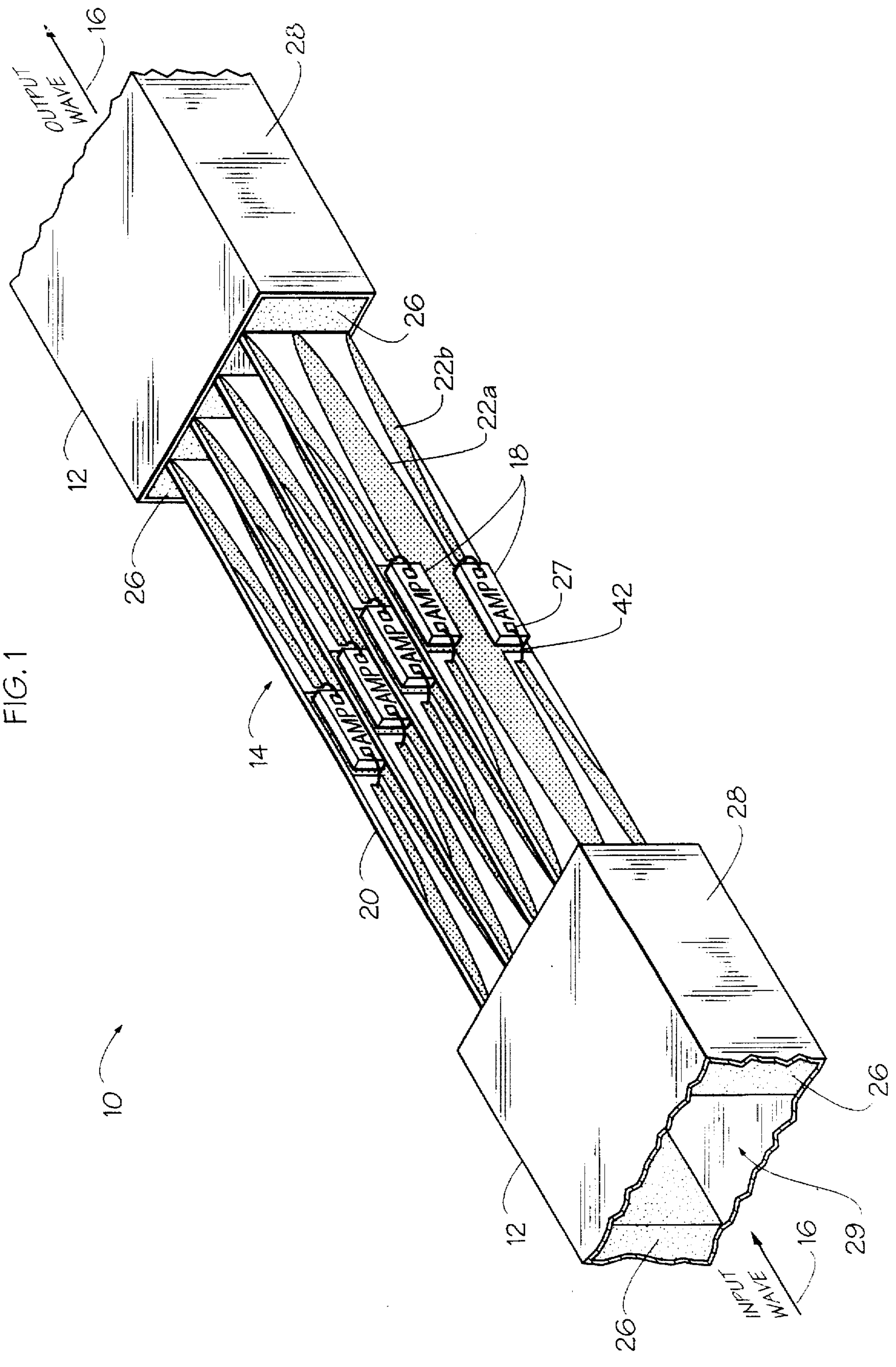
FIG. 1 is a perspective view of the spatial waveguide power combiner of the invention showing a portion of one of the stacked, spatially-fed power modules in perspective view apart from its combination in the array of the combiner.

FIG. 1 illustrates the perspective view a rectangular waveguide spatial power combiner, generally denoted by reference number 10. A conventional rectangular waveguide 12 is loaded with a two dimensional array of tapered slotline modules, generally denoted by reference number 14 in FIG. 1, which modules are planar and have their longitudinal plane arranged along the direction of waveguide propagation, symbolically depicted by arrow 16. Each slotline module 14 provides a gradual transition from the waveguide field within waveguide 12 to a transmission line for coupling with conventional microwave integrated circuitry, such as amplifiers 18 and/or other passive or active components. After passing through an active or passive circuit element, such as amplifier 18, the microwave signal is coupled into waveguide 12 using a similar tapered slot transition 36, described in greater detail in connection with FIGS. 2–5 below. The geometry of the taper is chosen to minimize reflections and optimize impedance matching and bandwidth. Tapered slotline 14 is inherently broad band which enables operation across the full waveguide band and which provides excellent input/output isolation.

In the illustrated embodiment of FIG. 1, four slotline modules 14 are shown spaced across the width of waveguide 12, but any number may be employed including positioning slotlines 14 to take advantage of transverse waveguide modes. In the illustration for simplicity, modules 14 are shown as evenly spaced between the walls of waveguide 12, but their position can be and usually is selected to provide as even an illumination of the input transmission slotlines 36 (see e.g. FIG. 2) as practical. This in turn is determined by the transverse wave pattern established across waveguide 12, the modification of which is further discussed below.

The front portion of a slotline 14 is depicted in an enlarged perspective view in FIG. 1 clearly showing the insulating substrate 20 on which metallizations **22*a* and 22*b* have been disposed to define tapered slot transition 36 as will be described in greater detail below in connection with FIGS. 2–4. Metallization 22*a* is coupled by means of a wire 42 to a bonding pad 27 provided on circuit 18. A similar wire 42 provided for the output from circuit 18 is shown as described in connection with FIGS. 4 and 5. In the illustrated embodiment, the double slotline is described symmetric about the lateral midline of slotline 14 to support upper and lower circuits 18, each with their own tapered transition slotline 36 feeding into circuit 18. It is expressly contemplated that many more than two circuits may be mounted vertically on module 14**.

As shown in FIG. 1, the plurality of slotline modules 14 are fixed between waveguides 12 by means now known or later devised with the waveguide illumination being altered to improve its uniformity across the array by dielectric loading 26 disposed in waveguide 12. In the illustrated embodiment dielectric loading 26 is provided only between the exterior walls 28 of waveguide 12 and the next adjacent slotline module 14 with free space being provided between the remaining slotline modules 14. Similar or identical loading 26 is provided both in the input and output apertures 29 of waveguides 12.

Figure 2:
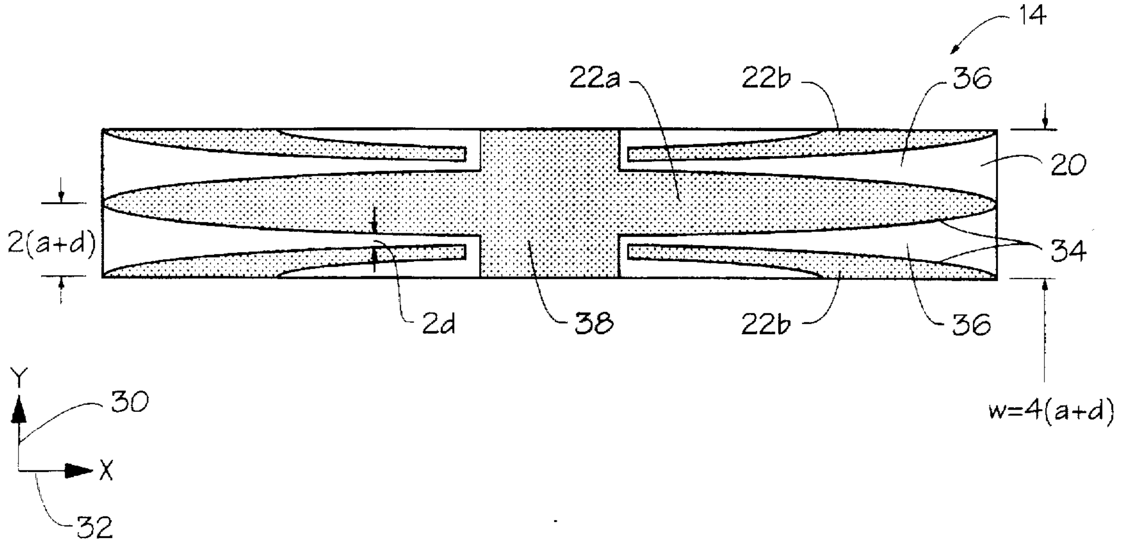
FIG. 2 is a side plan view of one of the power modules of FIG. 1 showing the tapered slotline with the amplifier removed.
Figure 6A:
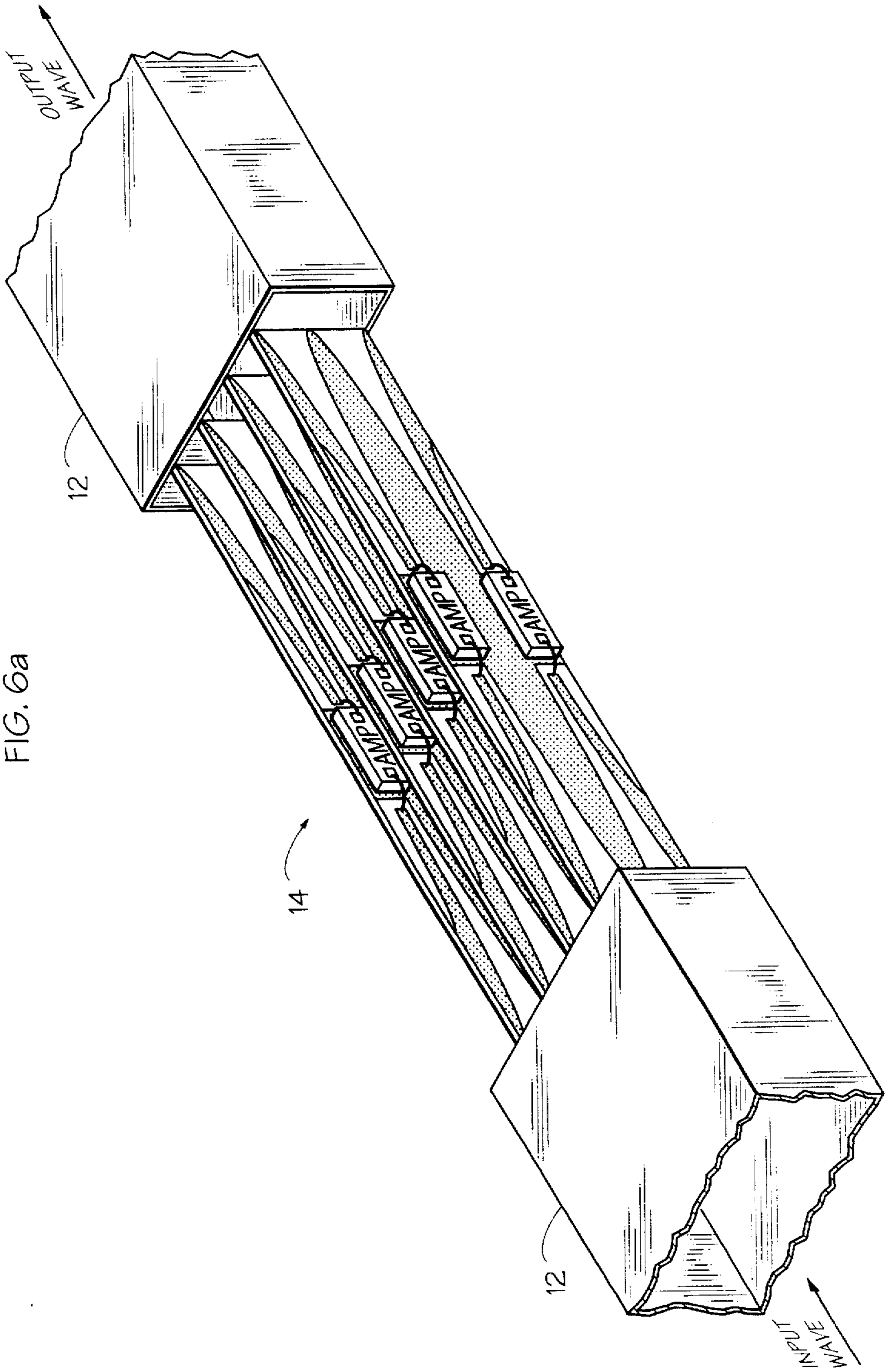
FIG. 6*a* is a perspective view of a 2×4 element array used in a first configuration and FIG. 6*b* is a perspective view of the same array used in a second configuration wherein penetration of tapered slots into the waveguide is used for optimizing or tuning circuit performance.
Figure 6B:
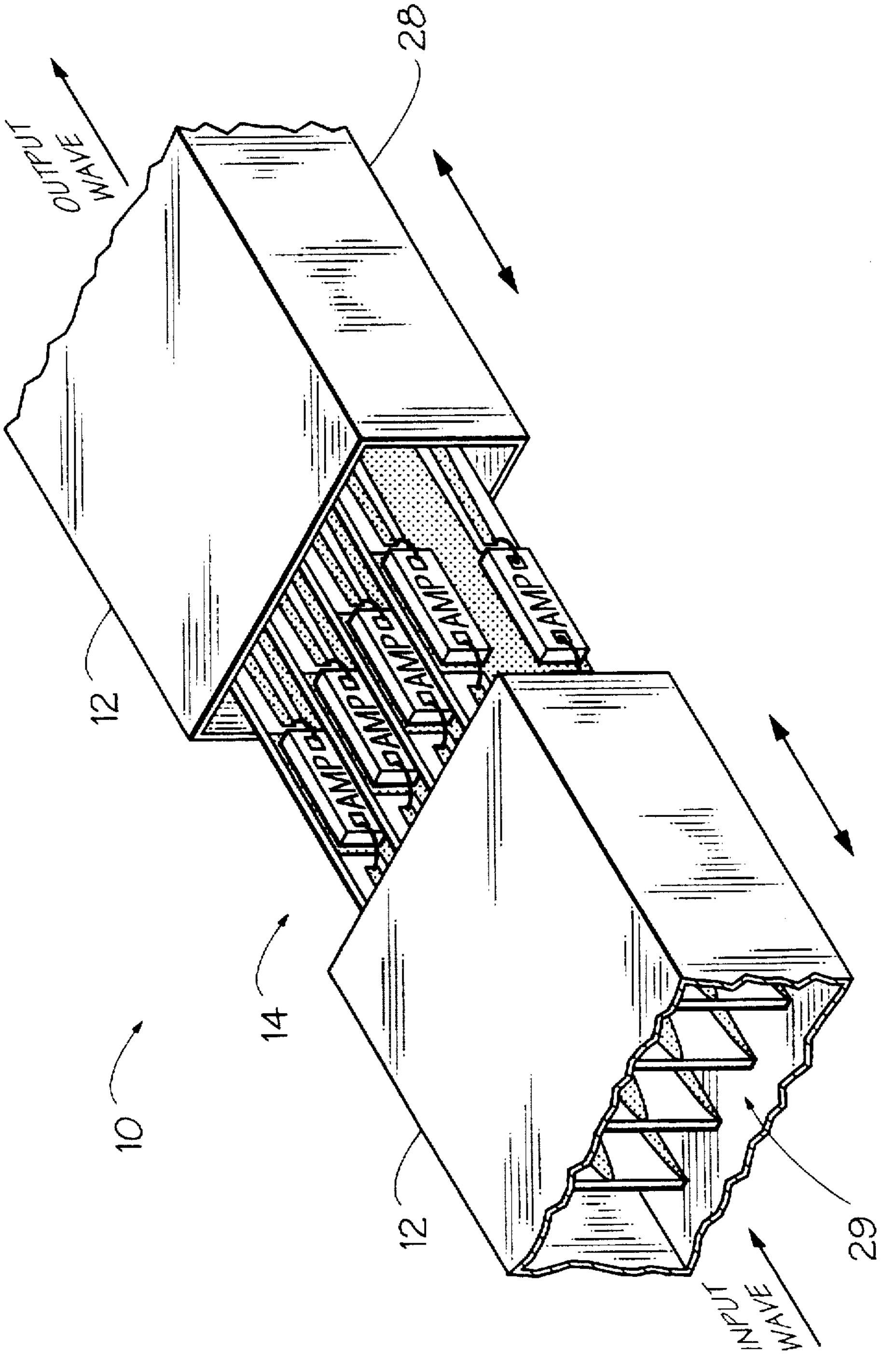

FIG. 2 shows a plan side view of one slotline module 14 of FIG. 1 with all circuit elements removed, and in particular shows the pattern of metallizations **22*a* and 22*b* on dielectric insulating board 20. Rectangular slotline module 14 is symmetric both about its horizontal and vertical bisecting axes and is characterized by a slotline transition 36 with a length b (FIG. 3), the broadest portion of slotline transition 36 being 2 ($a+d$) and the narrowest portion of slotline transition 36 being 2*d*. Substrate 20 in the illustrated embodiment is composed of aluminum nitride because of its high heat conductivity, but any other thermally conductive or heat sinking material may be selected depending on the application at hand. The substrates 20 of modules 14 may also be thermally coupled to any other type of heat sink now known or later devised. For example, cooling air, gas or fluid may be circulated through array 10 or heat pipes may be suitably connected to substrates 20. The height, w, of slotline module 14, is chosen to match the height of the rectangular waveguide 12 so that substrate 20 can be inserted into waveguide 12 as shown in FIGS. 1 and 6a and 6b (FIG. 3). The length of the tapered slot transition, b, of slotline 14 is chosen so that the impedance taper from the broadest part of slotline transition 36 to the narrowest part is gradual enough to minimize reflections. This design rule favors a long structure for slotline 14**, which is constrained by size constraints in any given application.

Figure 3:
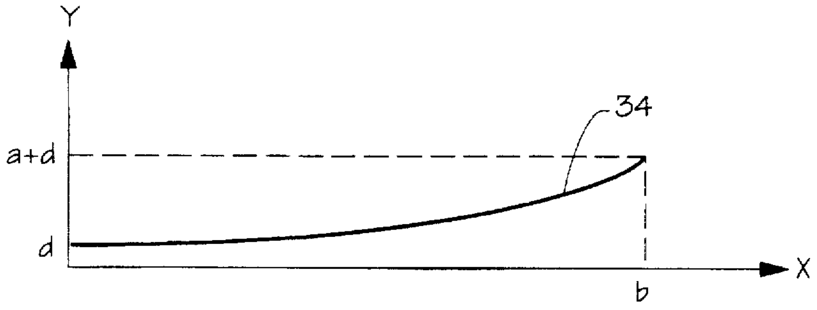
FIG. 3 is a graph describing the two dimensional curve of the taper of the slotline shown in FIG. 2.

In the illustrated embodiment, the actual shape of the taper preferred is shown in the graph of FIG. 3 wherein the direction of the taper and the Y direction 30 as depicted in FIG. 2 is graphed against the X direction 32. FIG. 3 illustrates half of the slotline taper, namely the shape of lines 34 of metallizations 22a and 22b depicted in FIG. 2. The equation of line 34 is given by:

$$y=a(1-\cos(\pi x/2b))+d$$

The particular taper shown in FIG. 3 is, however, only illustrative and many other tapers or curves may be used as well which serve the goal of providing a good transition or minimal reflection from waveguide 12 into slotline modules 14 through circuit 18 and thence in transition back to waveguide 12.

FIG. 2 shows a metallization pattern 22a and 22b wherein tapered slot transitions 36 are defined by adjacent metallizations. Two element arrays result in a central finger metallization 22a between upper and lower elements 22b. Central finger metallizations 22a from two adjacent slotlines then combine with a metallized base plate 38 (FIG. 3) onto which the circuit elements 18 are mounted.

Figure 5:
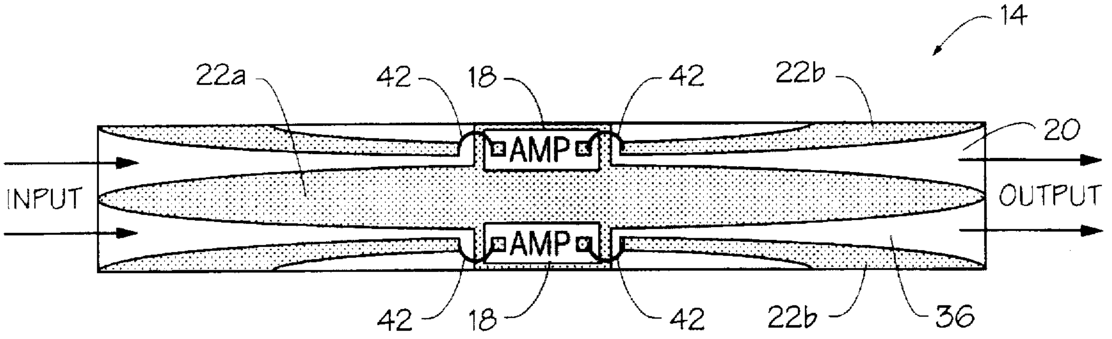
FIG. 5 is a top plan view of a two element amplifier array with amplifier chips as depicted in perspective view in FIG. 1.

Given the height, w, of modules 14, the number of slotline transistions 36 placed vertically on them as well as their shape as determined by the parameters b, d and a can be determined. The slotline impedance is made to match that of circuit 18 by adjusting the gap, 2d, appropriately. For example, 50 ohms is typically the nominal value used in the industry for microwave circuit impedance although any impedance could be employed. Amplifier circuits 18, such as those shown in FIG. 5, are stacked to form an array and then inserted into rectangular waveguide as depicted in FIGS. 1 and 6a and 6b. In particular, the 2×4 modular, namely two circuits combined with four tapered slot transitions 36 on each module 14 are illustrated, but more or fewer elements may be included on each slotline module 14 depending on the desired power combining and application. Any number of modules 14 may then be arranged in parallel in waveguide 12 to form an array of modules 14 according to the invention as needed to meet the power requirements.

Figure 4:
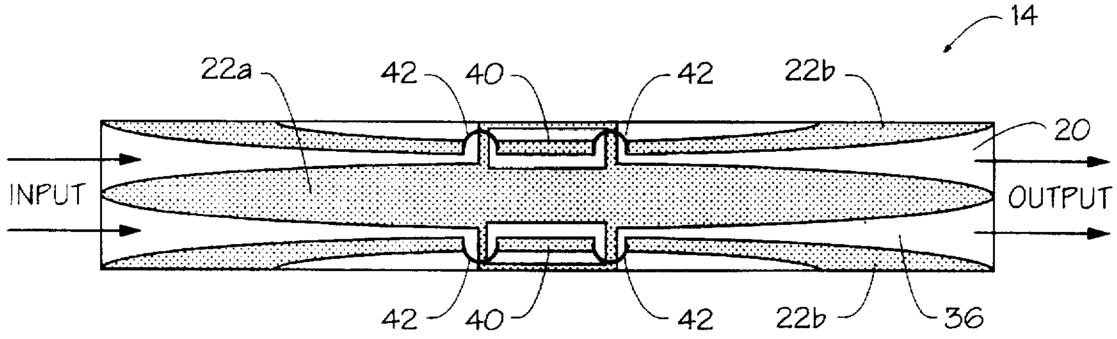
FIG. 4 is a plan view of a slotline to microstrip transition for a two element array devised according to the invention.

An alternative embodiment wherein slotlines transistions 36 are utilized to transition between waveguides 12 to a microstrip 40 is depicted in FIG. 4. The same metallization pattern and structure as shown in FIG. 2 is utilized with the exception that a 50 ohm microstrip line on a separate substrate is epoxied or soldered to base plate 38 (FIG. 2). FIG. 4 shows two isolated microstrip lines 40, which are electrically coupled to elements 22b through bonded wires 42 at both the input and output ends of the tapered slot transitions 36. This embodiment thus comprises a 50 ohm slotline to a 50 ohm microstrip coupling. Any microstrip element or circuit may then be connected to microstrip 40 or substituted for it. In the same manner, the side elevational view of slotline module 14 in FIG. 5 shows microstrip amplifier chips 18 mounted and wire bonded through wires 42 through metallizations 22b of slotline transitions 36.

The perspective illustrations of FIGS. 6a and 6b show slotline modules 14 with amplifiers 18 of FIG. 5 mounted into waveguides 12 in a first configuration or depth of insertion in FIG. 6a and in a second configuration or depth of insertion in FIG. 6b, wherein the ends of slotline modules 14 have been disposed into the input and output apertures 29 of waveguides 12 by equal distances to optimize overall circuit performance, namely for tuning the performance of the power combiner array 10 or minimizing the power reflections and maximizing the power transmission.

Figure 7:
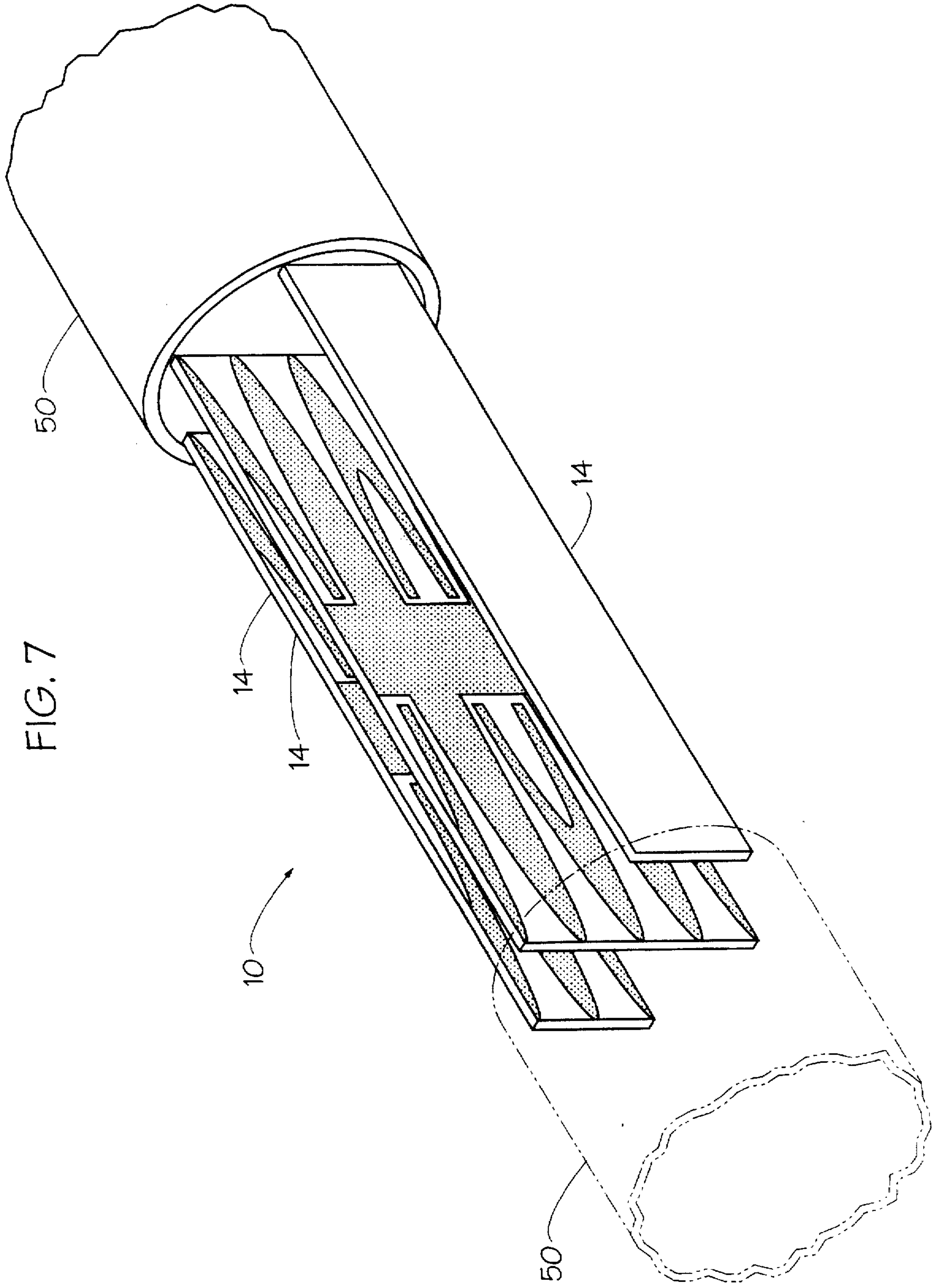
FIG. 7 is a perspective view of an alternative embodiment using a circular waveguide in place of a rectangular waveguide as described in connection with FIGS. 1 and 6*a*, *b*.
Figure 8:
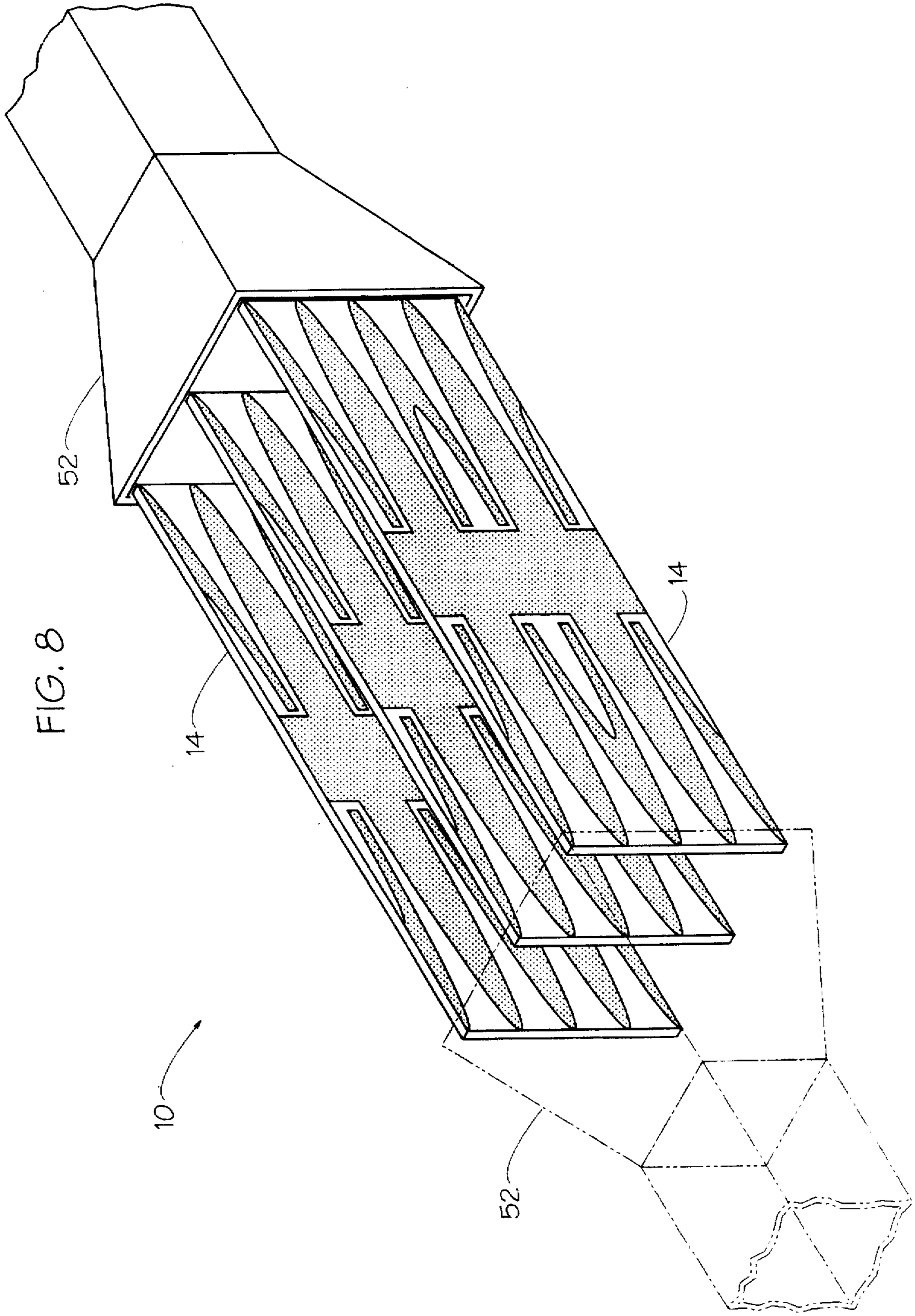
FIG. 8 is a perspective view of another alternative embodiment using an antenna coupling in place of the waveguides as described in connection with FIGS. 1, 6*a*, *b*, and 7.

As an example, an X-band amplifier module using a 2×2 array with a 3 dB bandwidth from 8 to 12 GHz was fabricated according to the above teachings. Peak gain of about 9 dB at 9 GHz was observed with a 2.9 Watt output power. The design can be monolithic or hybrid, i.e. circular waveguides 50 as depicted in FIG. 7, lens focused waveguides and other free space systems such as horn antennas 52 and the like as shown in FIG. 8 can be used at input or output illumination fields for the array 10 of modules 14 with full equivalency and in substitution of rectangular waveguides 12 which have been shown and described in the illustrated embodiment above.

Figure 9:
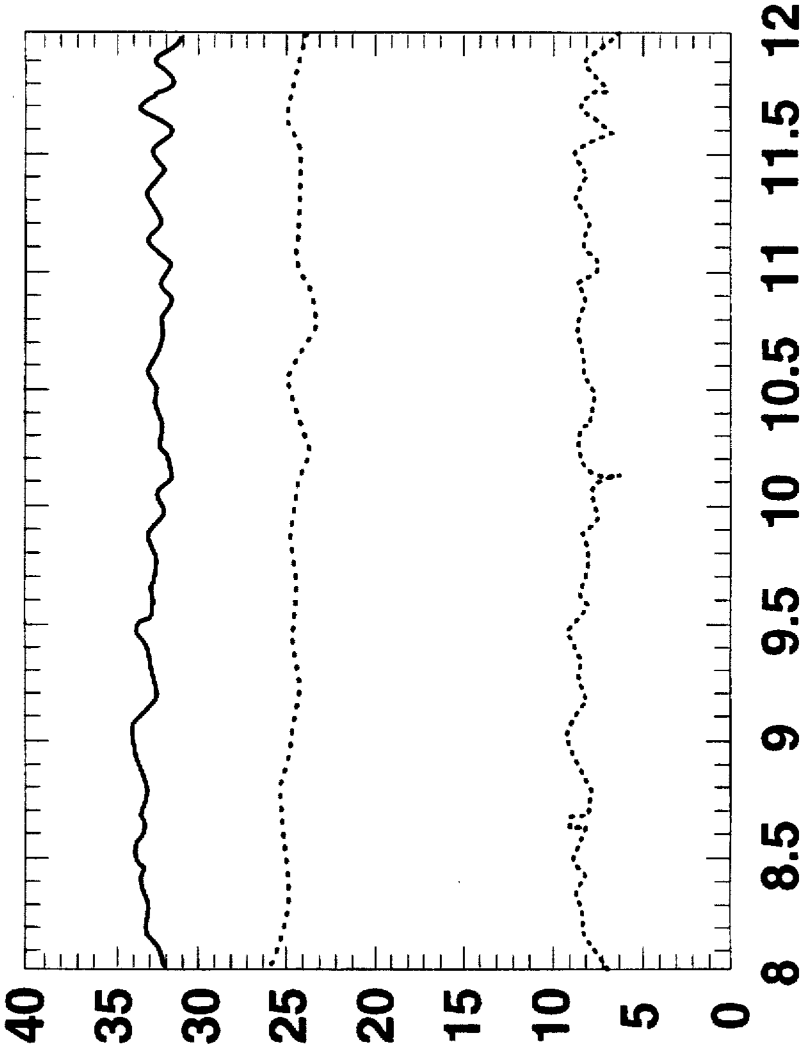
FIG. 9 is a graph showing the gain, input and output power of a 2×4 array in a rectangular X-band waveguide devised according to the invention as a function of frequency.

FIG. 9 is a graph of the experimental data of a 2×4 module 14 according to the invention in which and input and output power and gain is graphed on the vertical scale against frequency on the horizontal scale. Module 14 was subjected to continuous RF exposure or illumination, but was turned on and off in a pulsed mode to permit thermal sinking. Graph 54 depicts the upper power in dBm, graph 56 the input power in dBm while graph 58 is the gain in dB for the 2×4 module. FIG. 9 illustrates an essentially flat response between 8 to 12 GHz through the entire expand portion of the quasi-optical spectrum. There is essentially no roll of or an infinite bandwidth in the X band.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

Figure 10:
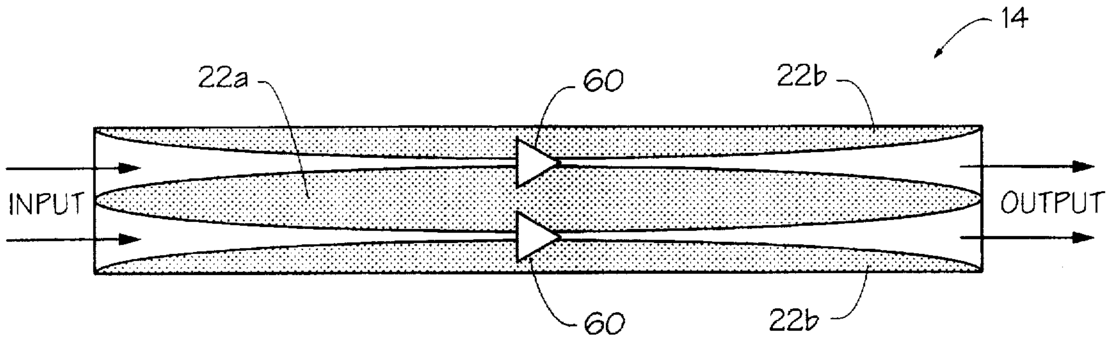
FIG. 10 is a diagrammatic side view of a module in which slotline amplifiers are coupled directly across the slotline metallizations.
Figure 11:
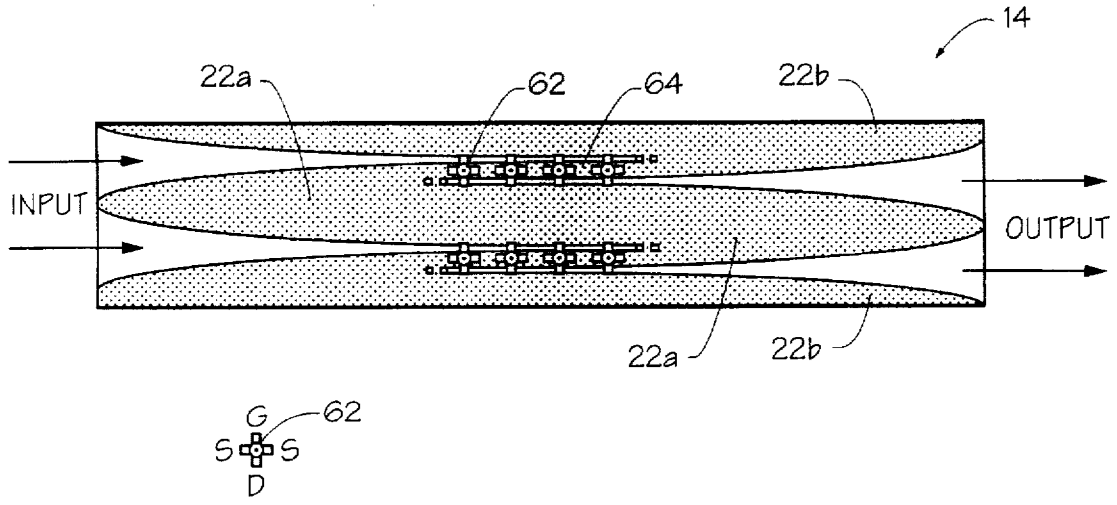
FIG. 11 is a diagrammatic side view of a module which is designed as a slotline traveling wave amplifier using a serpentine metallization coupling a plurality of field effect transistors (FET) between the slotline metallizations.

For example, while the above description illustrates the invention in a slotline-to-microstrip combination, it is also possible to leave the module design entirely in slotline form. FIG. 10 shows a module 14 in which slotline amplifiers 60 are coupled directly across metallizations 22a and 22b. FIG. 11 shows another embodiment in which module 14 is designed as a slotline traveling wave amplifier using a serpentine metallization 64 coupling a plurality of field effect transistors 62 (FET) between metallization 22a and 22b. The input and output slotline transmission lines use the gate and drain capacitances of FETs 62 to periodically load the transmission line. Capacitive loading effectively reduces the line impedance to 50 ohms. The bandwidth of this type of traveling wave amplifier is primarily limited in the upper end by the low pass filter behavior of the distributed transmission line. While distributed power amplifiers do not provide optimum gain, power and efficiency per device as compared to single tuned devices, the broad bandwidths and robust design favor their use in many applications.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the stone way to obtain substantially the same result.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A power combiner comprising:

a source for providing an input illumination field;

a two dimensional array of circuit elements comprising a row of slotline modules illuminated by said source, each said slotline module forming a column of said array and including at least two circuit elements, coupling said input illumination field into the circuit elements, and an output from the circuit elements being coupled to an output illumination field; and an output disposed in said output illumination field wherein a plurality of outputs from said row of slotline modules are combined, whereby high power combination is achieved.

2. The power combiner of claim 1 wherein said source and output are waveguides.

3. The power combiner of claim 2 wherein said waveguides are rectangular waveguides.

4. The power combiner of claim 3 wherein said waveguides are circular waveguides.

5. The power combiner of claim 1 wherein said source and output are antennas.

6. The power combiner of claim 1 wherein each said slotline module of said array comprises a tapered slot transition arranged and configured for signal matching between said source, said slotline module, and said output.

7. The power combiner of claim 6 wherein each slotline module comprises a pair of tapered slot transitions coupling said circuit elements to said source and said circuit elements to said output.

8. The power combiner of claim 6 wherein the shape of said tapered slot transition is described by the curve $y=a(1-\cos(\pi x/2b))+d$, where b is the longitudinal length of said tapered slot transition, $2(a+d)$ is a maximum width provided by said tapered slot transition and $2d$ is a minimum width provided by said tapered slot transition.

9. The power combiner of claim 1 wherein said slotline modules are laterally distributed across said input illumination field of said source to approximately evenly distribute power in said illumination field among said slotline modules.

10. The power combiner of claim 9 wherein said source is a waveguide and said waveguide is dielectrically loaded to enhance uniformity of said input illumination field.

11. The power combiner of claim 9 wherein said slotline modules are arranged within said output illumination field to approximately uniformly illuminate said output.

12. The power combiner of claim 11 wherein said output is a waveguide which is dielectrically loaded to approximately uniformly spread said output field across said slotline modules.

13. The power combiner of claim 1 wherein said circuit elements are quasi-optical amplifiers.

14. The power combiner of claim 13 wherein each slotline module has a horizontal and vertical axis and is symmetrically arranged with respect to said horizontal and vertical axes with respect to slotline transitions provided on said slotline module and said quasi-optical amplifiers connected thereto.

15. The power combiner of claim 1 wherein each slotline module has a horizontal and vertical axis and is symmetrically arranged with respect to said horizontal and vertical axes with respect to slotline transitions provided on said slotline module and said circuit elements connected thereto.

16. The power combiner of claim 1 wherein each of said slotline modules is disposed upon a thermally conductive heat sink.

17. The power combiner of claim 16 wherein said thermally conductive heat sink a substrate of aluminum nitride.

18. The power combiner of claim 1 wherein each of said slotline modules of said array are disposed relative to said source and output to enhance tuning from said source to said array of slotline modules and from said array of slotline modules to said output.

19. The power combiner of claim 18 wherein said source and output are waveguides wherein said array of slotline modules are longitudinally disposed within said waveguides to optimize tuning.

20. A method for providing quasi-optical power combination comprising the steps of:

illuminating a source field with quasi-optical power;

transferring said quasi-optical power from said source field into a two-dimensional array of quasi optical circuit elements comprised of a row of slotline modules, each of which comprises a column of at least two quasi optical circuit elements;

operating on said quasi-optical power transferred into said slotline modules within the quasi-optical circuit elements included in each of said slotline modules; and transferring said quasi-optical power from said quasi-optical circuit elements through said slotline modules to illuminate an output field wherein said quasi-optical power from each of said quasi-optical circuit elements is combined in said output field.

21. The method of claim 20 wherein said step of transferring said quasi-optical power from said source field into said slotline modules comprises transferring said optical power through a plurality of parallel tapered slotline transitions.

22. The method of claim 21 wherein said step of transferring said quasi-optical power operated on by said quasi-optical circuit elements comprises transferring said quasi-optical power from said quasi-optical circuit elements through a corresponding plurality of tapered slotline transitions.

23. The method of claim 20 wherein said step of transferring said quasi-optical power operated on by said quasi-optical circuit elements comprises transferring said quasi-optical power from said quasi-optical circuit elements through a corresponding plurality of tapered slotline transitions.

24. The method of claim 20 wherein the step of operating on said quasi-optical power within said quasi-optical circuit elements comprises amplifying said optical power by said quasi-optical circuit elements, each of which is comprised of amplifier.

25. The method of claim 20 further comprising the step of providing said quasi-optical power from a source to provide said source field and receiving said quasi-optical power from said output field at an output.

26. A power combiner comprising:

a source for providing an input illumination field;

an array of slotline modules illuminated by said source, each slotline module of said array including at least one circuit element and coupling said input illumination field into said at least one circuit element, an output from said at least one circuit element being coupled by said slotline module to an output illumination field; and an output disposed in said output illumination field wherein a plurality of outputs from said array of slotline modules are combined, wherein each said slotline module of said array comprises a pair of tapered slot transitions arranged and configured for signal matching between said source, each said slotline module, and said output, and coupling at least one circuit element to said source and at least one circuit element to said output.

27. A power combiner comprising:

a source for providing an input illumination field;

an array of slotline modules illuminated by said source, each slotline module of said array including at least one circuit element and coupling said input illumination field into said at least one circuit element, an output from said at least one circuit element being coupled by said slotline module to an output illumination field; and an output disposed in said output illumination field wherein a plurality of outputs from said array of slotline modules are combined, wherein each said slotline module of said array comprises a tapered slot transition arranged and configured for signal matching between said source, each said slotline module, and said output, and wherein the shape of said tapered slot transition is described by the curve $y=a(1-\cos(\pi x/2b))+d$, where b is the longitudinal length of said tapered slot transition, $2(a+d)$ is a maximum width provided by said tapered slot transition and $2d$ is a minimum width provided by said tapered slot transition.

28. A power combiner comprising:

a source for providing an input illumination field;

an array of slotline modules illuminated by said source, with the slotline modules laterally distributed across said input illumination field of said source to approximately evenly distribute power in said illumination field among said slotline modules, each slotline module of said array including at least one circuit element and coupling said input illumination field into said at least one circuit element, an output from said at least one circuit element being coupled by said slotline module to an output illumination field; and an output disposed in said output illumination field wherein a plurality of outputs from said array of slotline modules are combined.

29. The power combiner of claim 28 wherein said array of slotline modules is arranged within said output illumination field to approximately uniformly illuminate said output which is a waveguide dielectrically loaded to approximately uniformly spread said output illumination field across said array of slotline modules.

* * * * *